United States Patent
Furusawa et al.

(10) Patent No.: US 8,338,966 B2
(45) Date of Patent: Dec. 25, 2012

(54) JOINT STRUCTURE, JOINING MATERIAL, AND METHOD FOR PRODUCING JOINING MATERIAL CONTAINING BISMUTH

(75) Inventors: Akio Furusawa, Osaka (JP); Shigeaki Sakatani, Osaka (JP); Hidetoshi Kitaura, Osaka (JP); Taichi Nakamura, Osaka (JP); Takahiro Matsuo, Osaka (JP)

(73) Assignee: Panasonic Corporation, Osaka (JP)

( * ) Notice: Subject to any disclaimer, the term of this patent is extended or adjusted under 35 U.S.C. 154(b) by 61 days.

(21) Appl. No.: 13/003,024

(22) PCT Filed: Jun. 17, 2010

(86) PCT No.: PCT/JP2010/004048
§ 371 (c)(1),
(2), (4) Date: Jan. 7, 2011

(87) PCT Pub. No.: WO2010/150495
PCT Pub. Date: Dec. 29, 2010

(65) Prior Publication Data
US 2011/0108996 A1    May 12, 2011

(30) Foreign Application Priority Data
Jun. 22, 2009  (JP) ................................ 2009-147408

(51) Int. Cl.
*H01L 23/48* (2006.01)
(52) U.S. Cl. ...................................................... 257/779
(58) Field of Classification Search ................... 257/779
See application file for complete search history.

(56) References Cited

U.S. PATENT DOCUMENTS

| 6,365,973 | B1 * | 4/2002 | Koning ......................... 257/772 |
| 2003/0108664 | A1 * | 6/2003 | Kodas et al. ................... 427/125 |
| 2003/0180451 | A1 * | 9/2003 | Kodas et al. ................... 427/123 |
| 2010/0089498 | A1 * | 4/2010 | Ikeda et al. ..................... 148/22 |

FOREIGN PATENT DOCUMENTS

| JP | 2001-353590 A | 12/2001 |
| JP | 2004-114093 A | 4/2004 |
| JP | 2007-190583 A | 8/2007 |
| JP | 2007-281412 A | 10/2007 |

OTHER PUBLICATIONS

Y. Yamada, Y. Takaku, Y. Yagi, Y. Nishibe, I. Ohnuma, Y. Sutou, R. Kainuma, K. Ishida, Pb-free high temperature solders for power device packaging, Microelectronics Reliability, vol. 46, Issues 9-11, Sep.-Nov. 2006, pp. 1932-1937.*

(Continued)

*Primary Examiner* — Thao Le
*Assistant Examiner* — Laura Dykes
(74) *Attorney, Agent, or Firm* — RatnerPrestia

(57) ABSTRACT

The present invention provides a semiconductor component having a joint structure including a semiconductor device, an electrode disposed opposite the semiconductor device, and a joining material which contains Bi as main component and connects the semiconductor device to the electrode. Since the joining material contains a carbon compound, joint failure due to the difference in linear expansion coefficient between the semiconductor device and the electrode can be reduced compared with conventional materials. The joining material which contains Bi as main component enables provision of a joint structure in which a semiconductor device and an electrode are joined by a joint more reliable than a conventional joint.

8 Claims, 5 Drawing Sheets

OTHER PUBLICATIONS

Furukawa, T., N. Oshima and H. Funakubo. Development of a Novel Bismuth Precursor for MOCVD, TOSOH Research & Technology Review, vol. 50, 2006, pp. 41-44.*

Jenn-Ming Song, Hsin-Yi Chuang, and Zong-Mou Wu. Substrate Dissolution and Shear Properties of the Joints between Bi-Ag Alloys and Cu Substrates for High-Temperature Soldering Applications, Journal of Electronic Materials, vol. 36, No. 11, 2007, pp. 1516-1523.*

International Search Report for International Application No. PCT/JP2010/004048, Aug. 10, 2010, Panasonic Corporation.

* cited by examiner (a)

(b)

JOINT STRUCTURE, JOINING MATERIAL, AND METHOD FOR PRODUCING JOINING MATERIAL CONTAINING BISMUTH

CROSS-REFERENCE TO RELATED APPLICATIONS

This application is a U.S. national phase application of PCT International Patent Application No. PCT/JP2010/004048 filed Jun. 17, 2010, claiming the benefit of priority of Japanese Patent Application No. 2009-147408 filed Jun. 22, 2009, all of which are incorporated by reference herein in their entirety.

TECHNICAL FIELD

The present invention relates to a joint structure including a lead-free joining material and, in particular, to a joint structure, a joining material, and a method for producing the joining material for semiconductor components in which semiconductor devices made of a semiconductor such as Si, GaN, and SiC are joined to electrodes.

BACKGROUND ART

Semiconductor components are mounted onto a wiring board with solder material. For example, Sn-3Ag-0.5Cu (wt. %) having a melting point of 220° C. is commonly used for soldering semiconductor components such as IGBTs (Insulated Gate Bipolar Transistors) to a wiring board.

FIG. 7 is a schematic diagram of a semiconductor component mounted on a wiring board. When the semiconductor component 1 is mounted onto the wiring board 2, a solder bath dipping system is used to solder an external electrode 4 of the semiconductor component 1 to a wiring board electrode 5 by using solder material 3, for example Sn-3Ag-0.5Cu (wt. %) which has a melting point of 220° C. Here, since the solder material 3 is heated to a temperature in the range of 250 to 260° C. by the dipping system, the temperature in the semiconductor component 1 can reach a temperature in the range of 250 to 260° C. The semiconductor component 1 contains a semiconductor device 6 and an electrode 7 joined with a joining material 8. When the joining material 8 melts inside the semiconductor component 1, a short circuit, a break, or a change in electrical characteristics of the semiconductor component can occur and a defect can occur in an end product. The joining material 8 used inside the semiconductor component 1 therefore needs to have a higher melting temperature than the highest temperature in the semiconductor component 1 that can be reached when soldering in the dipping system.

An appropriate joining material that has a melting point higher than 260° C. and does not contain Pb may be one that contains 90 wt. % or more of Bi (hereinafter referred to as "a joining material containing Bi as main component") (for example, Bi-2.5Ag (wt. %) with a melting point of 262° C. or Bi-0.8Cu (wt. %) with a melting point of 270° C.). While Zn is under investigation as another possible joining material, presently joining materials which contain Bi as main component are appropriate in terms of wetting characteristics and the ease with which a joint can be made. A power semiconductor module using a joining material which contains Bi as main component has been proposed (see Japanese Patent Laid-Open No. 2007-281412 (p. 24 and FIG. 2, for example)). FIG. 8 is a cross-sectional view of the conventional joint structure (power semiconductor module) described in Japanese Patent Laid-Open No. 2007-281412 (p. 24 and FIG. 2, for example).

In FIG. 8, a power semiconductor module 9 includes a Cu layer 13 formed on the surface of a power semiconductor device 10 on the joint 12 side for joining with a joining material. The Cu layer 13 is joined to an electrode 11 by the joint 12. The joint 12 is made of a joining material which contains Bi as main component.

SUMMARY OF INVENTION

Technical Problem

However, since Bi, which is the main component of the joint 12, is harder than Pb, the joint 12 cannot resist a stress applied to the joint 12 due to the difference in linear expansion coefficient between the power semiconductor device 10 and the electrode 11 heated by heat radiated from the power device 10 in operation and then crack occurs. Therefore, there was the problem that the quality of the product is unstable and the reliability of the joint is low.

Measurement on the conventional power semiconductor module 9 has shown that the mean cycles between failures of the power semiconductor module 9 was 310 cycles. The measurement was conducted under the following conditions. A temperature cycling test was conducted on the power semiconductor module 9 that uses a joining material which contains Bi as main component (Bi-0.8Cu (wt. %)) at a lower temperature of −65° C. and a higher temperature of 150° C. to test the operation of the power semiconductor module 9. The mean cycles between failures that resulted in a failure rate of 0.15% was calculated with a sample count of N=15.

The present invention solves the conventional problem described above. The present invention is directed to provide a joint structure, a joining material, and a method for producing the joining material that are capable of providing an improved reliability, for example an improved mean cycles between failures, of a joint than a conventional case.

Means for Solving the Problems

The 1$^{st}$ aspect of the present invention is a joint structure comprising:
a semiconductor device;
an electrode disposed opposite the semiconductor device; and
a joining material which contains Bi as main component and connects the semiconductor device to the electrode;
wherein the joining material which contains Bi as main component contains a carbon compound.

The 2$^{nd}$ aspect of the present invention is the joint structure according to the 1$^{st}$ aspect of the present invention, wherein the carbon compound is a carbon compound contained in a metal complex having a ligand.

The 3$^{rd}$ aspect of the present invention is the joint structure according to the 2$^{nd}$ aspect of the present invention, wherein the ligand comprises at least one functional group selected from the group consisting of a carboxyl group, an aldehyde group, a thiol group, a hydroxyl group, a phosphino group, an amino group, and a methyl group.

The 4$^{th}$ aspect of the present invention is the joint structure according to the 2$^{nd}$ aspect of the present invention, wherein a metal constituting the metal complex is Bi.

The 5$^{th}$ aspect of the present invention is the joint structure according to the 1$^{st}$ aspect of the present invention, wherein the joining material contains:

one or more elements selected from Cu which content is in a range from 0.1 to 1% by weight and Ag which content is in a range from 0.1 to 9% by weight;

a metal material containing Bi which content is 90% by weight or more; and carbon which content is in a range from 0.02 to 0.25% by weight.

The 6$^{th}$ aspect of the present invention is a joining material which joins a semiconductor device to an electrode disposed opposite the semiconductor device and contains Bi as main material, wherein the joining material contains a carbon compound.

The 7$^{th}$ aspect of the present invention is the joining material according to the 6$^{th}$ aspect of the present invention, wherein the carbon compound is a carbon compound contained in a metal complex having a ligand.

The 8$^{th}$ aspect of the present invention is the joining material according to the 7$^{th}$ aspect of the present invention, wherein the ligand has at least one functional group selected from the group consisting of a carboxyl group, an aldehyde group, a thiol group, a hydroxyl group, a phosphino group, an amino group, and a methyl group.

The 9$^{th}$ aspect of the present invention is a method for producing a joining material which contains Bi as main component and connects a semiconductor device to an electrode disposed opposite the semiconductor device, the method comprising the steps of:

a Cu layer forming step of forming a Cu layer on a surface of the electrode;

a Bi-complex forming step of forming a layer of a Bi-complex containing a carbon compound and having a ligand on the electrode on which the Cu layer has been formed; and a heating step of heating the electrode on which the Bi-complex layer has been formed to a temperature higher than or equal to a melting point of the Bi.

The 10$^{th}$ aspect of the present invention is the method for producing a joining material according to the 9$^{th}$ aspect of the present invention, wherein the ligand has at least one functional group selected from the group consisting of a carboxyl group, an aldehyde group, a thiol group, a hydroxyl group, a phosphino group, an amino group, and a methyl group.

According to the present configuration, the reliability of a joint between a semiconductor device and an electrode can be improved as compared to a conventional case.

ADVANTAGEOUS EFFECTS OF INVENTION

According to the present invention, the reliability, for example the mean cycles between failures, of a joint between a semiconductor device and an electrode can be improved as has been described above.

DESCRIPTION OF EMBODIMENTS

Embodiments of the present invention will be described below with reference to drawings.

(First Embodiment)

Figure 1:
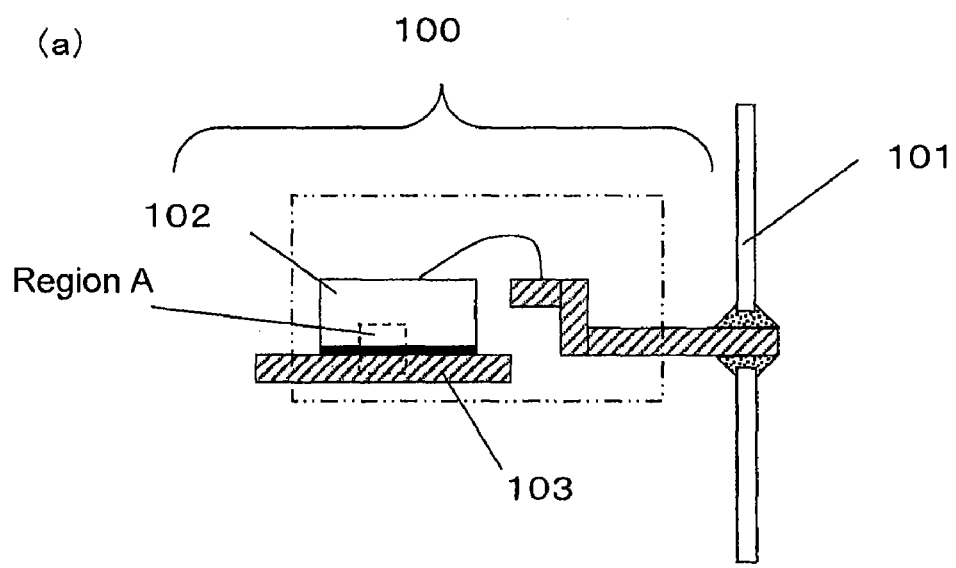
FIG. 1(a) is a cross-sectional view of a joint structure in a first embodiment of the present invention.
FIG. 1(b) is an enlarged schematic diagram of region A enclosed in a dashed box in FIG. 1(a).
Figure 1:
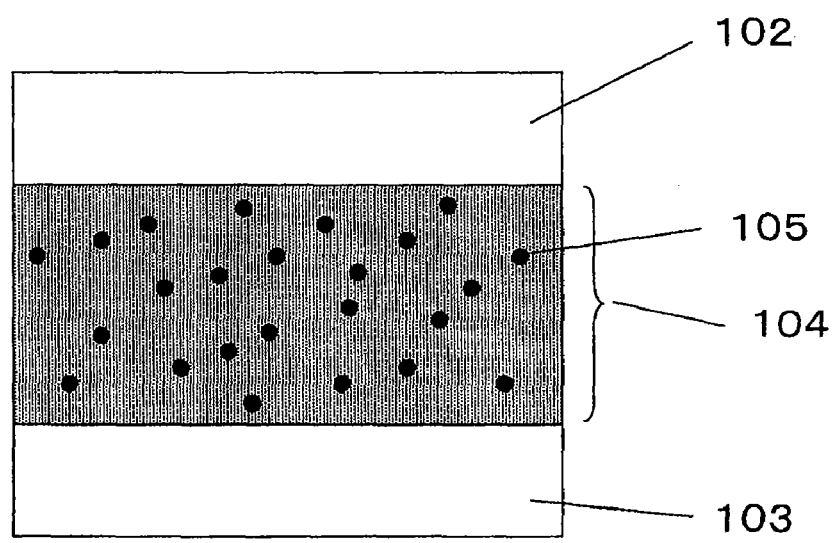

FIG. 1 is cross-sectional views of a joint structure of a first embodiment of the present invention.

FIG. 1(a) is a schematic diagram of a semiconductor component mounted on a wiring board. FIG. 1(b) is an enlarged view of region A enclosed in the dashed box in FIG. 1(a).

The semiconductor component 100 in FIG. 1(a) is mounted on the wiring board 101. The inner structure of the semiconductor component 100 will be described with reference to FIG. 1(b), which is an enlarged view of region A including an semiconductor device 102 and an electrode 103.

In FIG. 1(b), the semiconductor device 102 is joined to the electrode 103 by a joining material 104. The joining material 104 is Bi-0.8Cu (wt. %) (with a melting point of 270° C.) containing carbon 105, which is a constituent element of a carbon compound, dispersed therein. Although not shown, a Cu layer is formed on the surface of the semiconductor device 102 that faces the electrode 103. The Cu layer is formed for joining with the joining material 104.

Figure 2:
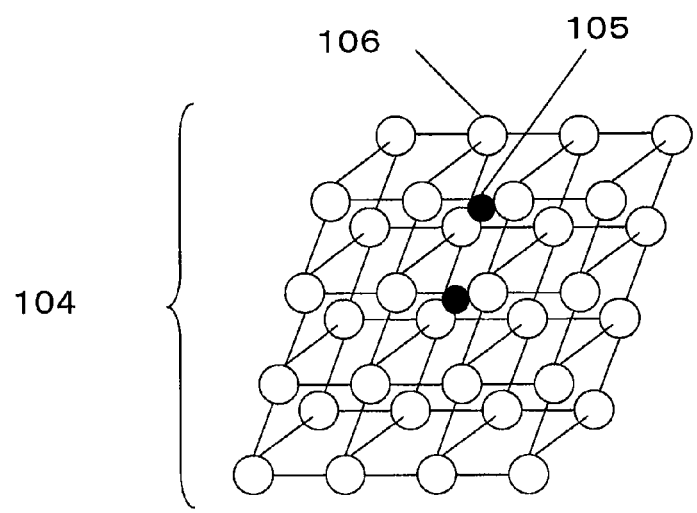
FIG. 2 is a diagram illustrating a structure of a joining material in the first embodiment of the present invention.

FIG. 2 is a model illustrating a structure of the joining material 104 in which carbon 105 is dispersed. The main component, Bi 106, of the joining material 104 has a rhombohedral crystal structure. Since carbon 105, which has an atomic radius of 70 pm, is smaller than Bi 106, which has an atomic radius of 160 pm, carbon 105 enters spaces in the crystal lattice of Bi 106 and is dispersed in the joining material 104.

The dispersed-carbon-bearing joining material 104 herein is defined as a joining material 104 having a form in which carbon 105 is present in spaces in the crystal lattice of Bi 106.

Figure 3:
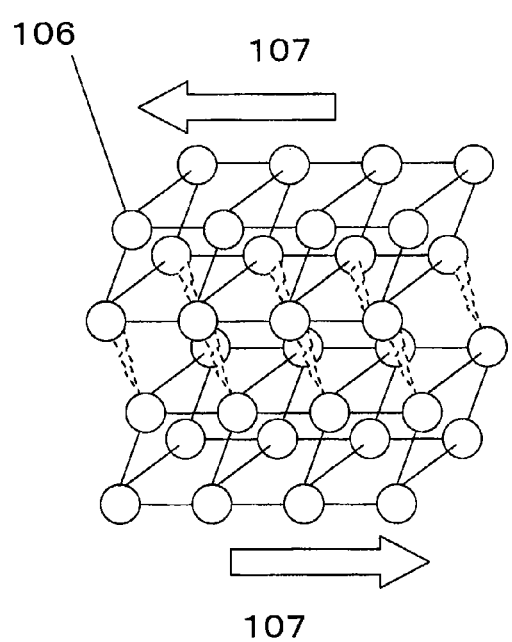
FIG. 3 is a diagram illustrating a conventional joining material under stress due to the difference in linear expansion coefficient between a semiconductor device and an electrode.

FIG. 3 illustrates a conventional joining material under stress due to the difference in linear expansion coefficient between a semiconductor device and an electrode. Stress 107 applied distorts the crystal lattice of Bi. When the distortion exceeds the recovery limit, the crystal lattice is broken and cannot be restored.

Dashed curves in FIG. 3 indicate broken portions of the crystal lattice.

Figure 4:
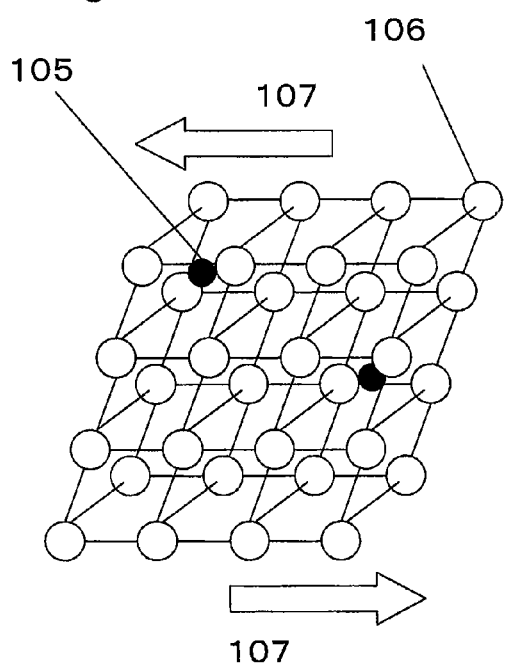
FIG. 4 is a diagram illustrating a joining material dispersed carbon under stress due to the difference in linear expansion coefficient between a semiconductor material and en electrode.

FIG. 4 illustrates an example to which a configuration of the present embodiment has been applied and is a diagram illustrating a dispersed-carbon-bearing joining material under stress due to the difference in linear expansion coefficient between a semiconductor device and an electrode.

The inventor presumes that the crystal lattice of Bi 106 in the dispersed-carbon-bearing joining material of the present embodiment resists destruction for the following reason.

Adjacent Bi atoms are strongly bound by a metallic bond whereas carbon cannot form a metallic bond with Bi and therefore exists in a more readily mobile form in spaces in the lattice structure of Bi than Bi. Accordingly, carbon 105 under stress 107 moves through spaces in the crystal lattice of Bi 106 and absorbs part of energy of the stress before the crystal lattice of Bi 106 distorts. The effect prevents significant destruction of the crystal lattice of Bi 106.

When a stress is applied to the dispersed-carbon-bearing joining material of the present embodiment, the crystal lattice of Bi 106 is not totally indestructive but part of the crystal lattice is destroyed. However, the use of the dispersed-carbon-bearing joining material reduces the percentage of destroyed portion of the crystal lattice as compared with that of conventional joining materials and therefore improves the joining reliability of the joining material as a whole.

Atoms of any element that has a melting point higher than the melting point of Bi, 271° C., and an atomic radius smaller than that of Bi, 160 pm, and does not react with Bi may be dispersed in spaces in the crystal lattice of Bi. The element is not limited to carbon; atoms of an element such as Be (with a melting temperature of 1278° C. and an atomic radius of 112 pm), B (2079° C./85 pm), Mg (650° C./150 pm), Al (660° C./125 pm), or Si (1414° C./110 pm) may be chosen.

Since B is the smallest in atomic radius among the five elements given above, B is most readily dispersed in spaces in the crystal lattice of Bi, followed by Si, Be, Al, and Mg in that order.

The larger the atomic radius is, the lower the mobility in the crystal lattice of Bi is, so that the effect of absorbing stress energy has a tendency to decrease and also the reliability of the joint has the same tendency to decrease.

Since Mg has the lowest melting point among the five elements given above, Mg can be dispersed in spaces in the crystal lattice of Bi at low temperature.

More than one of these elements may be used together. If more than one element is used together, any combination of the elements may be used, such as carbon+B, Be+Al, Mg+Si, carbon+Al+Si. However, these elements have larger atomic radii than carbon, which has an atomic radius of 70 pm. Since an element with an atomic radius greater than 50% of the atomic radius of Bi, 160 pm, can hardly enter spaces in the crystal lattice of Bi, carbon is the best element.

The semiconductor device 102 is made of Si, has a size of 4.5 mm×3.55 mm and has been diced out of a wafer that is 6 inches in diameter and 0.3 mm thick. The semiconductor device 102 is not limited to Si; the semiconductor device 102 may be made of Ge or a compound semiconductor such as GaN, GaAs, InP, ZnS, ZnSe, SiC, or SiGe. The size of the semiconductor device 102 depends on the intended function of the semiconductor device. A semiconductor device may be as large as 6 mm×5 mm or may be as small as 3 mm×2.5 mm or 2 mm×1.6 mm, for example. The thickness of the semiconductor device 102 may vary depending on the size of the semiconductor device and is not limited to 0.3 mm. For example, a semiconductor device 102 that is 0.4 mm, 0.2 mm, or 0.15 mm thick may be used.

The electrode 103 is made of a Cu alloy. A 1-μm-thick surface treatment layer of Ag (not shown) is formed on the surface of the electrode 103 on the joining material side by electrolytic plating in order to ensure wetting with the joining material. The surface treatment layer may be made of Au, Ni, or Pd which exhibits good wetting with the joining material. The surface treatment layer may be formed to a thickness of greater than or equal to 1 μm by taking into account a thickness variation of 1 μm and may be made by vapor deposition or electroless plating instead of electrolytic plating.

In typical soldering, a flux containing a halide such as Br or Cl is used in order to remove an oxide from and clean the surfaces of a joining material and electrodes to provide good soldering. The flux may be mixed in the joining material or may be supplied in a step preceding or succeeding the step of providing the joining material. The flux exhibits reducing capability to remove oxides during heating in soldering. However, since the flux lefts residues of the halide in the joint after soldering, migration failure can occur due to moisture ingress and influence of a potential difference. The power semiconductor component of the first embodiment does not use a flux in soldering because the power semiconductor component is intended to be used in a power supply circuit and needs to be highly reliable as such.

A procedure for fabricating a power semiconductor component having the joint structure of the first embodiment will be described below.

A silicon semiconductor device of the present embodiment on which a dispersed-carbon-bearing joining material is formed to a thickness of 20 μm is provided. Then, a lead frame made of Cu with an electrode 103 (die pad) plated with 0.5-μm-thick Ag is heated in a nitrogen atmosphere containing 5% of hydrogen to 320° C. The reducing capability of hydrogen removes oxides. Since hydrogen is a gas, the hydrogen does not remain in the joint after soldering. A silicon semiconductor device of the present embodiment on which the dispersed-carbon-bearing joining material has been formed is placed on the heated die pad. Once the joining material melts at the melting point of Bi, 270° C., to join the semiconductor device to the electrode 103 (die pad), the heating is stopped and the structure is cooled below 270° C. in a cooling step to fix the structure.

The content of carbon 105 will be described below.

Figure 5:
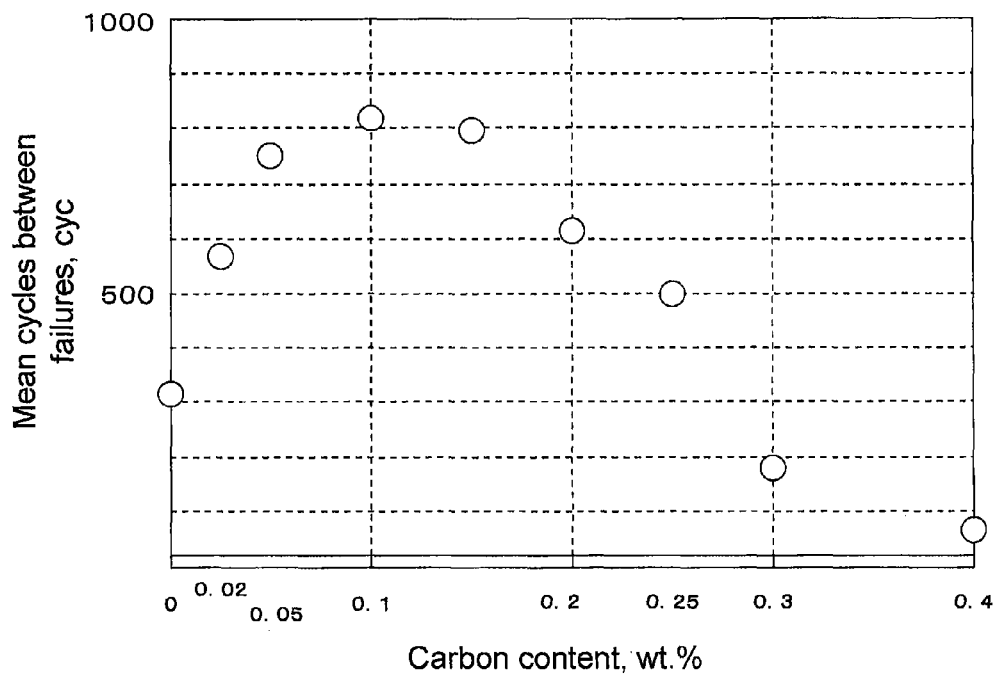
FIG. 5 is a diagram illustrating the relationship between carbon content and the mean cycles between failures of a semiconductor device.

FIG. 5 illustrates the relationship between carbon content of the joining material and the mean cycles between failures. Here, the carbon content of Bi-0.8Cu (wt. %) was varied. Here, carbon contents shows contents of carbon when the weight of Bi-0.8Cu (wt. %) is assumed to be 100.

The content of carbon can be quantified with a SIMS (Secondary Ion-microprobe Mass Spectrometry). The SIMS is an analytical technique used for elemental analysis in a minute area of the surface of a solid and can detect all elements, including hydrogen, with a high sensitivity. The SIMS can measure the amount of an element with small atomic weight, such as carbon, in ppm unit.

Even if carbon alone is mixed with a joining material, which contains Bi as main component, melted by heating, the carbon will be separated at the surface of the melted metal containing Bi because carbon cannot form a metal bond with Bi. That is, the aim of dispersing carbon in spaces in the crystal lattice of Bi cannot be accomplished by simply mixing carbon with the joining material.

Therefore, in order to accomplish the aim, a metal complex containing carbon was added to the joining material which contains Bi as main component.

Accordingly, carbon herein is contained in the metal complex including a ligand. The ligand has at least one or more functional groups selected from the group consisting of a carboxyl group, an aldehyde group, a thiol group, a hydroxyl group, a phosphino group, an amino group, and a methyl group. The ligand includes a functional group having lone electron-pairs. The group binds coordinately to a metal such as Bi or Cu to form a complex. The coordinating ability of a functional group depends on the type of ligand. The carboxyl group has the strongest coordinating ability, followed by aldehyde, thiol, hydroxyl, phosphino, amino, and methyl groups in that order. A binding force between the metal (here, metal such as Bi or Cu) and the functional group that constitute a complex is required in order to sufficiently disperse carbon in spaces in the crystal lattice of Bi, which is the main component. Accordingly, preferably a carboxyl group or an aldehyde group, which has a high coordinating ability, is used in the present embodiment.

The horizontal axis of the graph in FIG. 5 represents the carbon content of the joining material. Specifically, a bismuth complex including an ethylenediaminetetraacetate ligand having a carboxyl functional group was added to the joining material. The content of carbon was adjusted to a predetermined amount by changing the percentage of the bismuth complex contained in the joining material. The carbon content of the joining material was obtained by conducting surface analysis of a cross section of the joining material with SIMS and calculating the percentage of carbon in the cross section.

The ligand is not limited to ethylenediaminetetraacetate; the ligand may be diethylenetriaminepentaacetate or nitrilotriacetate that constitutes a bismuth complex. The functional group is not limited to a carboxyl group; the functional group may be an aldehyde group, a thiol group, a hydroxyl group, a phosphino group, an amino group, or a methyl group. More than one ligand may be used together. The vertical axis of the graph represents the mean cycles between failures measured by a reliability test. A temperature cycling test was conducted on an IGBT fabricated with a joint structure joined according to the first embodiment at a lower temperature of −65° C. and a higher temperature of 150° C. to test the operation of the IGBT. The mean cycles that resulted in a failure rate of 0.15% was calculated with a sample count of N=15.

Too low a carbon content is undesirable because a joint failure due to thermal stress cannot be prevented and the joint can be broken. Too high a carbon content is undesirable because joining of Bi to the semiconductor device and the electrode is inhibited and a good joint cannot be provided.

Here, the reference mean cycles between failures is set to 500 cycles on the basis of product quality standards for judgment. Although the reference mean cycles between cycles as quality standards may vary depending on the type of product, in general a product with 500 cycles between failures or more can be judged as being acceptable.

As can be seen from the results in FIG. 5, when the carbon content is in the range of 0.05 to 0.15 wt. %, the mean cycles between failures is 700 cycles or more, which represents a satisfactory thermal stress reduction effect. When the carbon content is 0.02 wt. %, the mean cycles between failures decreases to 570 cycles. However, it can be said that an effect is achieved as compared with the set reference value of 500 cycles between failures. On the other hand, when the carbon content is 0.3 wt. %, the mean cycles between failures is 180 cycles, which is undesirably low. This is because the amount of carbon that can enter spaces in the crystal lattice of Bi to disperse in the joining material is limited, surplus carbon that exceeds the limit appears at the surface of the joining material, and prevents joining of the joining material to the semiconductor device and electrode. When the carbon content is 0.25 wt. %, the mean cycles between failures decreases to 500 cycles but it can be said that a thermal stress reduction effect is produced, because the set reference mean cycles between failures is 500 cycles.

From the foregoing, it follows that a thermal stress reduction effect can be provided when the carbon content is in the range of 0.02 wt. % to 0.25 wt. %.

While Al can be used in place of carbon, Al does not readily enter spaces in the crystal lattice of Bi because the atomic radius of Al is as large as 125 pm, which is approximately 178% of the atomic radius of carbon. It is necessary that Al content of the joining material is increased in order to obtain a failure prevention effect of the same level (mean cycles between failures of the same level) as carbon has.

Figure 6:
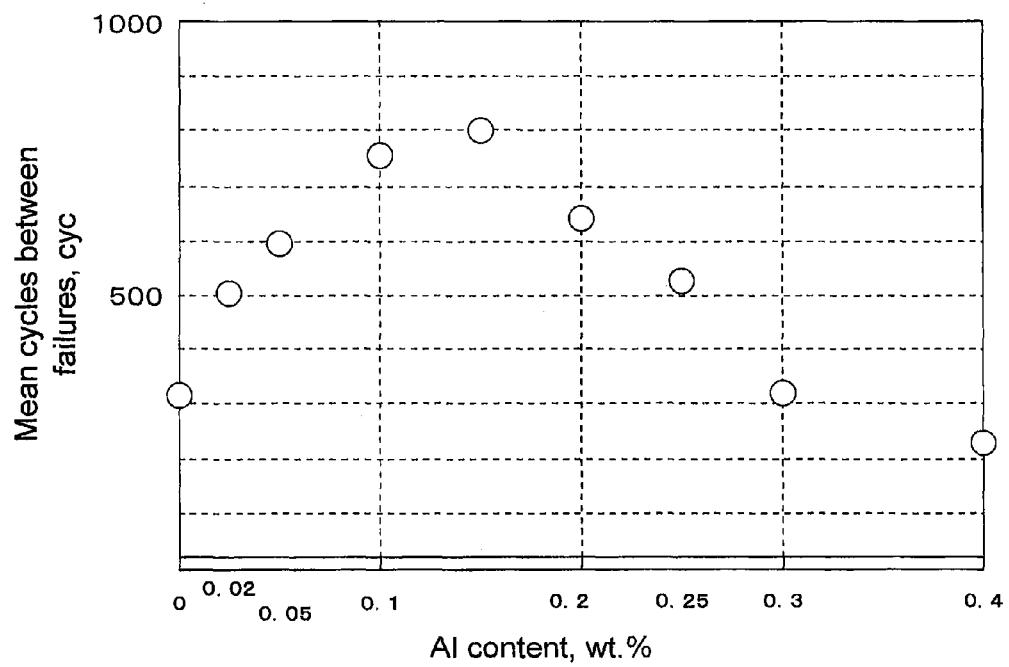
FIG. 6 is a diagram illustrating the relationship between Al content and the mean cycles between failures of a semiconductor device.
Figure 7:
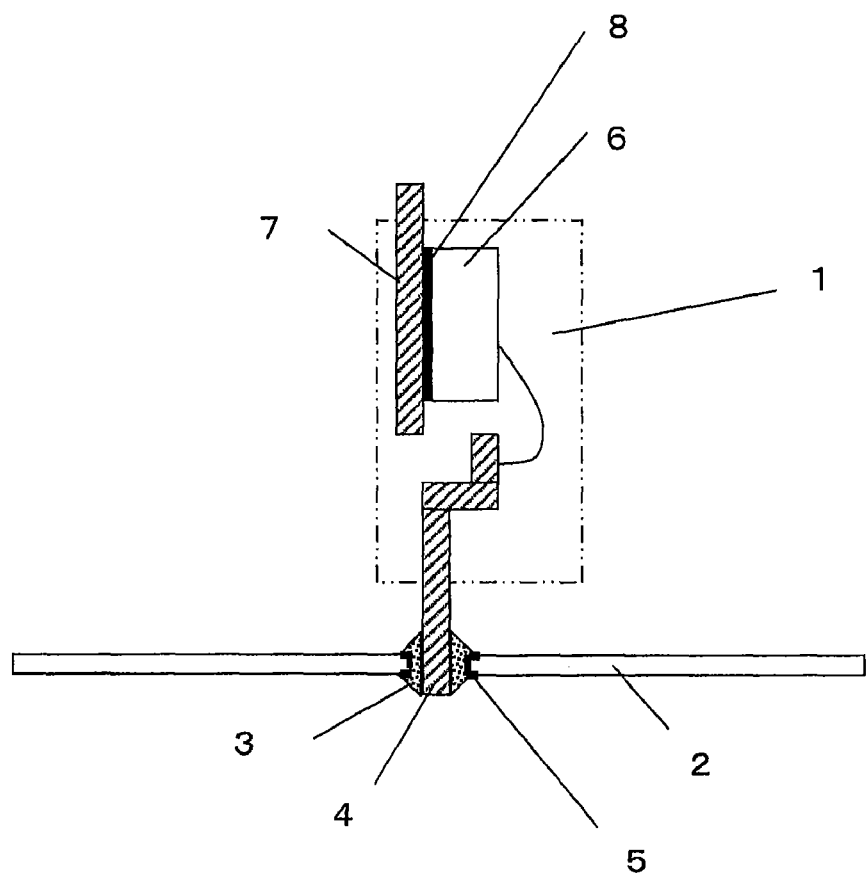
FIG. 7 is a schematic diagram illustrating a semiconductor device mounted on a wiring board.
Figure 8:
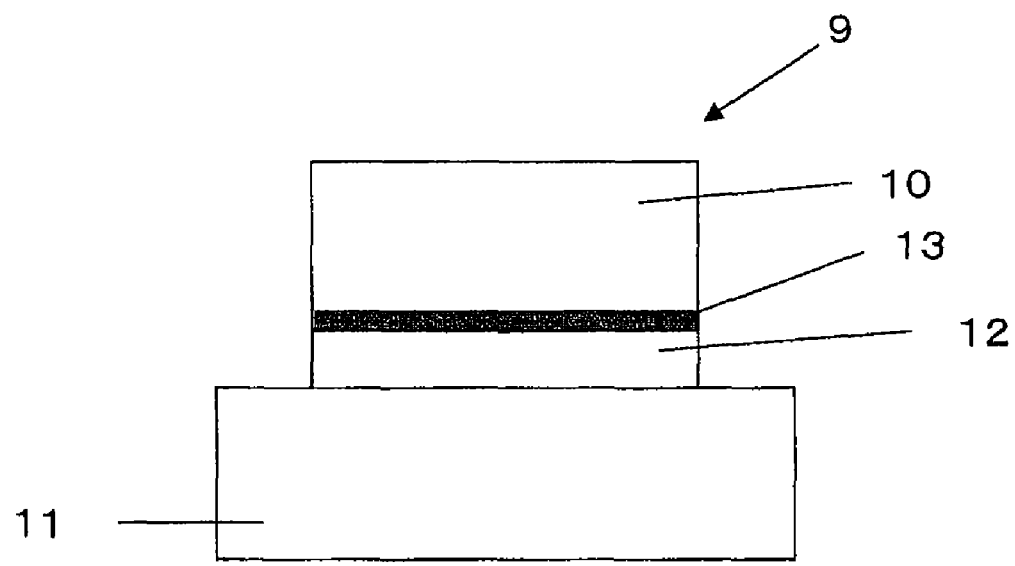
FIG. 8 is a cross-sectional view of a conventional joint structure (a power semiconductor module).

FIG. 6 is a graph illustrating the relationship between Al content of the joining material and the mean cycles between failures. Here, Al content of Bi-0.8Cu (wt. %) is varied.

The horizontal axis of the graph in FIG. 6 represents Al content of the joining material. After Al is added to Bi-0.8Cu (wt. %) heated to 950° C., the joining material is cooled. The vertical axis represents the mean cycles between failures measured by a reliability test conducted on an IGBT fabricated with a joint structure joined according to the first embodiment at a lower temperature of −65° C. and a higher temperature of 150° C. to test the operation of the IGBT. The mean cycles that resulted in a failure rate of 0.15% was calculated with a sample count of N=15.

Too low an Al content is undesirable because a failure of the joint due to thermal stress cannot be prevented and the joint can be broken. Too high an Al content is undesirable because joining of Bi to the semiconductor device and the electrode is inhibited and a good joint cannot be provided.

As can be seen from the results in FIG. 6, when the Al content is in the range of 0.1 to 0.15 wt. %, the mean cycles between failures is 700 cycles or more, which represents a satisfactory thermal stress reduction effect. Carbon content of 0.05 wt. % results in 700 cycles between failures or more, however, an Al content of 0.05 wt. % does not result in 700 cycles between failures or more because Al does not readily enter spaces in the crystal lattice of Bi. However, when the Al content is 0.05 wt. %, the mean cycles between failures is 600 cycles, which shows that Al is effective with reference to the set reference value of 500 cycles between failures. When the Al content is 0.02 wt. %, the mean cycles between failures decreases to 500 cycles. However, it can be said that the Al content was effective since the set reference values of 500 cycles between failures is achieved even in this case.

On the other hand, when the Al content is 0.3 wt. %, the mean cycles between failures is unpreferably 310 cycles. This is because the amount of Al that can enter spaces in the crystal lattice of Bi to disperse in the joining material is limited, surplus Al that exceeds the limit appears at the surface of the joining material and prevents joining of the joining material to the semiconductor device and electrode. When the Al content is in the range of 0.2 to 0.25 wt. %, the mean cycles between failures decreases to the range of 645 to 520 cycles but it can be said that a thermal stress reduction effect is produced as with carbon since the set reference value of the mean cycles between failures is 500 cycles.

From the foregoing, it follows that a thermal stress reduction effect can be provided when the Al content is in the range of 0.02 wt. % to 0.25 wt. %.

One example of metal complexes that can be used with the present embodiment is an aluminum complex including a tris(2,4-pentanedionato) ligand having a carboxyl functional group. Here, the ligand has at least one functional group selected from the group consisting of a carboxyl group, an aldehyde group, a thiol group, a hydroxyl group, a phosphino group, an amino group, and a methyl group.

The joining material 104 will be described below.

A method for forming a layer of the joining material 104, which is Bi-0.8Cu (wt. %), to a thickness of 10 μm will be described first.

A 0.1-μm-thick Cu layer is formed by vapor deposition on the surface of an electrode 103 that is to face a semiconductor device 102. Then, a bismuth complex including an ethylenediaminetetraacetate ligand having a carboxyl functional group is formed to a thickness of 9.9 μm by electrolytic plating. The structure is heated to 320° C., which is higher than the melting point of bismuth, in a nitrogen atmosphere containing 5% of hydrogen. As a result, bismuth is melt and Cu formed by vapor deposition diffuses in bismuth to form a Bi-0.8Cu (wt. %) alloy in which carbon from the complex is dispersed.

The joining material 104 used contains 0.8% wt. % of Cu in addition to 90 wt. % or more of Bi as the remainder excluding unavoidable impurities. The composition of the joining material 104 is not limited to Bi—Cu. Other composition such as Bi—Ag, Au—Sn, Au—Si, Au—Ge, or Zn—Al can be used. Since the upper limit of heating temperature of a typical die bonding apparatus for joining semiconductor devices to electrodes is in the range of 350 to 400° C., a joining material that melts at a temperature lower than or equal to approximately 350° C. is desired.

The melting point of Bi is 271° C. As Cu is added to Bi, the melting temperature reaches a eutectic temperature of 270° C. at 0.5 wt. % of Cu. As Cu is further added, the melting temperature reaches 351° C. at 1 wt. % of Cu (for example see Composition 3 in Table 1), which is approximately equal to the upper limit of heating temperature.

As Ag is added to Bi, the liquid-phase temperature decreases. At 2.5 wt. %, the melting temperature reaches a eutectic temperature of 262° C. As Ag is further added, the melting temperature reaches 350° C. at 9 wt. % of Ag (for example see Composition 25 in Table 1), which is approximately equal to the upper limit of the heating temperature.

Cu and Ag are precipitated in the Bi structure and contribute to improvement of the metal strength when the weight of joining material containing Bi as main component is assumed to be 100. Accordingly, the content of Cu and Ag is preferably at least 0.1% by weight or more.

Table 1 shows variations in melting point and mean cycles between failures depending on the composition of the joining material of the present embodiment.

element selected from the group consisting of 0.1 to 1 wt. % Cu and 0.1 to 9 wt. % Ag. A joining material having any composition that has a melting point in the range between 260° C. and 351° C. inclusive may be used.

In Table 1, Compositions 1 to 13 show the cases in which the content of carbon and the content of Cu or Ag are varied while the content of Al is fixed at 0.

The difference between Group A of Compositions 1 to 6 and Group B of Compositions 7 to 13 is that the content of Ag is fixed to 0 and the content of Cu is changed in Group A whereas the content of Cu is fixed at 0 and the content of Ag is changed in Group B.

Compositions 14 to 18 show the cases in which the content of Al is varied while the content of carbon is fixed at 0.

Compositions 19 and 20 show the cases in which B or Si and Cu or Ag are contained in addition to carbon while the content of Al was fixed at 0.

Compositions 21 to 23 show the cases in which B, Si, or Be, and Cu and/or Ag are contained, in addition to Al while the content of carbon is fixed at 0.

Compositions 24 and 25 show the cases in which both carbon and Al are contained.

With these configurations, stress due to the difference in linear expansion coefficient between a semiconductor device and an electrode can be reduced by adding a metal complex containing carbon 105 or Al to a joining material which contains Bi as main component and consequently a high-quality, reliable joining between the semiconductor device and the electrode can be accomplished.

Industrial Applicability

A joint structure, a joining material and a method for producing the joining material of the present invention are capable of reducing joint failure due to the difference in linear

TABLE 1

| | Joining material [Unit: wt. %] | | | | | | | | Melting point | Mean cycles between failures |
|---|---|---|---|---|---|---|---|---|---|---|
| | Metal material | | | | | | | | | |
| | Cu | Ag | Bi | Carbon | B | Si | Be | Al | | |
| Composition 1 | 1.0 | 0 | Remainder | 0.02 | 0 | 0 | 0 | 0 | 348° C. | 580 |
| Composition 2 | 1.0 | 0 | Remainder | 0.15 | 0 | 0 | 0 | 0 | 350° C. | 790 |
| Composition 3 | 1.0 | 0 | Remainder | 0.25 | 0 | 0 | 0 | 0 | 351° C. | 500 |
| Composition 4 | 0.8 | 0 | Remainder | 0.02 | 0 | 0 | 0 | 0 | 300° C. | 570 |
| Composition 5 | 0.8 | 0 | Remainder | 0.15 | 0 | 0 | 0 | 0 | 301° C. | 780 |
| Composition 6 | 0.8 | 0 | Remainder | 0.25 | 0 | 0 | 0 | 0 | 303° C. | 500 |
| Composition 7 | 0 | 0.1 | Remainder | 0.2 | 0 | 0 | 0 | 0 | 269° C. | 580 |
| Composition 8 | 0 | 2 | Remainder | 0.05 | 0 | 0 | 0 | 0 | 264° C. | 710 |
| Composition 9 | 0 | 2 | Remainder | 0.1 | 0 | 0 | 0 | 0 | 264° C. | 800 |
| Composition 10 | 0 | 8.5 | Remainder | 0.02 | 0 | 0 | 0 | 0 | 347° C. | 590 |
| Composition 11 | 0 | 5.0 | Remainder | 0.25 | 0 | 0 | 0 | 0 | 295° C. | 500 |
| Composition 12 | 0 | 1.0 | Remainder | 0.1 | 0 | 0 | 0 | 0 | 268° C. | 750 |
| Composition 13 | 0.7 | 1.5 | Remainder | 0.15 | 0 | 0 | 0 | 0 | 270° C. | 770 |
| Composition 14 | 0.5 | 2.0 | Remainder | 0 | 0 | 0 | 0 | 0.02 | 265° C. | 480 |
| Composition 15 | 0.2 | 0.4 | Remainder | 0 | 0 | 0 | 0 | 0.1 | 270° C. | 770 |
| Composition 16 | 0 | 0.1 | Remainder | 0 | 0 | 0 | 0 | 0.25 | 269° C. | 500 |
| Composition 17 | 0.1 | 0 | Remainder | 0 | 0 | 0 | 0 | 0.2 | 271° C. | 490 |
| Composition 18 | 0.1 | 0.1 | Remainder | 0 | 0 | 0 | 0 | 0.15 | 270° C. | 480 |
| Composition 19 | 0 | 2.5 | Remainder | 0.1 | 0.05 | 0 | 0 | 0 | 262° C. | 670 |
| Composition 20 | 0.8 | 0 | Remainder | 0.15 | 0 | 0.1 | 0 | 0 | 277° C. | 510 |
| Composition 21 | 0.5 | 1 | Remainder | 0 | 0 | 0 | 0.12 | 0.12 | 264° C. | 470 |
| Composition 22 | 0 | 5 | Remainder | 0 | 0.05 | 0 | 0.05 | 0.05 | 301° C. | 650 |
| Composition 23 | 0.1 | 2 | Remainder | 0 | 0 | 0.1 | 0 | 0.1 | 282° C. | 540 |
| Composition 24 | 0.8 | 2.5 | Remainder | 0.15 | 0 | 0 | 0 | 0.1 | 263° C. | 740 |
| Composition 25 | 0 | 9 | Remainder | 0.1 | 0 | 0 | 0 | 0.1 | 350° C. | 590 |

As can be seen from Table 1, Compositions 1 to 25 have melting points higher than or equal to 260° C. and less than or equal to 351° C., contain 90 wt. % or more of Bi as the remainder excluding unavoidable impurities, and at least one expansion coefficient between a semiconductor device and an electrode and therefore are applicable to semiconductor packages such as power semiconductors and low power transistors.

| Reference Signs List | |
|---|---|
| 1 | Semiconductor component |
| 2 | Wiring board |
| 3 | Solder material |
| 4 | External electrode |
| 5 | Wiring board electrode |
| 6 | Semiconductor device |
| 7, 11 | Electrode |
| 8 | Joining material |
| 9 | Power semiconductor module |
| 10 | Power semiconductor device |
| 12 | Joint |
| 13 | Cu layer |
| 100 | Semiconductor component |
| 101 | Wiring board |
| 102 | Semiconductor device |
| 103 | Electrode |
| 104 | Joining material |
| 105 | Carbon |

The invention claimed is:

1. A joint structure comprising:
a semiconductor device;
an electrode disposed opposite the semiconductor device; and
a joining material which contains Bi as main component and connects the semiconductor device to the electrode;
wherein the joining material which contains Bi as main component contains a carbon compound contained in a metal complex having a ligand, and
carbon which is a constituent element of the carbon compound is dispersed in space in a crystal lattice of the Bi.

2. The joint structure according to claim 1, wherein the ligand comprises at least one functional group selected from the group consisting of a carboxyl group, an aldehyde group, a thiol group, a hydroxyl group, a phosphino group, an amino group, and a methyl group.

3. The joint structure according to claim 1, wherein a metal constituting the metal complex is Bi.

4. The joint structure according to claim 1, wherein the joining material contains:
one or more elements selected from Cu which content is in a range from 0.1 to 1% by weight and Ag which content is in a range from 0.1 to 9% by weight;
a metal material containing Bi which content is 90% by weight or more; and
the carbon which content is in a range from 0.02 to 0.25% by weight.

5. A joining material which joins a semiconductor device to an electrode disposed opposite the semiconductor device and contains Bi as main material, wherein the joining material contains a carbon compound contained in a metal complex having a ligand, and
carbon which is a constituent element of the carbon compound is dispersed in space in a crystal lattice of the Bi.

6. The joining material according to claim 5, wherein the ligand has at least one functional group selected from the group consisting of a carboxyl group, an aldehyde group, a thiol group, a hydroxyl group, a phosphino group, an amino group, and a methyl group.

7. A method for producing a joining material which contains Bi as main component and connects a semiconductor device to an electrode disposed opposite the semiconductor device, the method comprising the steps of: a Cu layer forming step of forming a Cu layer on a surface of the electrode; a Bi-complex forming step of forming a layer of a Bi-complex containing a carbon compound and having a ligand on the electrode on which the Cu layer has been formed; and a heating step of heating the electrode on which the Bi-complex layer has been formed to a temperature higher than or equal to a melting point of the Bi,
wherein in the layer of the Bi-complex, carbon which is a constituent element of the carbon compound is dispersed in space in a crystal lattice of the Bi.

8. The method for producing a joining material according to claim 7, wherein the ligand has at least one functional group selected from the group consisting of a carboxyl group, an aldehyde group, a thiol group, a hydroxyl group, a phosphino group, an amino group, and a methyl group.

* * * * *